US009897927B2

(12) United States Patent
Fresquet et al.

(10) Patent No.: US 9,897,927 B2
(45) Date of Patent: Feb. 20, 2018

(54) DEVICE AND METHOD FOR POSITIONING A PHOTOLITHOGRAPHY MASK BY A CONTACTLESS OPTICAL METHOD

(71) Applicant: FOGALE NANOTECH, Nîmes (FR)

(72) Inventors: Gilles Fresquet, Garrigues-Sainte-Eulalie (FR); Guenael Ribette, Argentré-du-Plessis (FR)

(73) Assignee: UNITY SEMICONDUCTOR, Montbonnot-Saint-Martin (FR)

( * ) Notice: Subject to any disclaimer, the term of this patent is extended or adjusted under 35 U.S.C. 154(b) by 0 days.

(21) Appl. No.: 15/039,833

(22) PCT Filed: Nov. 28, 2014

(86) PCT No.: PCT/EP2014/076009
§ 371 (c)(1),
(2) Date: May 26, 2016

(87) PCT Pub. No.: WO2015/082363
PCT Pub. Date: Jun. 11, 2015

(65) Prior Publication Data
US 2016/0377995 A1    Dec. 29, 2016

(30) Foreign Application Priority Data
Dec. 4, 2013 (FR) ..................................... 13 62065

(51) Int. Cl.
*G03F 7/20* (2006.01)
*G03F 9/00* (2006.01)

(52) U.S. Cl.
CPC .......... *G03F 7/70733* (2013.01); *G03F 9/703* (2013.01); *G03F 9/7038* (2013.01); *G03F 9/7088* (2013.01)

(58) Field of Classification Search
CPC .... G03F 7/70733; G03F 9/703; G03F 9/7038; G03F 9/7088
See application file for complete search history.

(56) References Cited

U.S. PATENT DOCUMENTS 4,475,223 A * 10/1984 Taniguchi ................. G03F 7/20
250/491.1
4,636,626 A * 1/1987 Hazama ................. G03F 9/7023
250/201.4

(Continued)

OTHER PUBLICATIONS

French Search Report from French Patent Application No. 1362065, dated Sep. 5, 2014.

(Continued)

*Primary Examiner* — Steven H Whitesell Gordon
(74) *Attorney, Agent, or Firm* — Greer, Burns & Crain, Ltd.

(57) ABSTRACT

A device for positioning a mask relative to the surface of a wafer with a view to the exposure of the wafer, which includes (i) first positioning structure suitable for holding and moving the mask and the wafer in relation to each other; (ii) imaging structure suitable for producing at least one image of the mask and of the surface of the wafer according to at least one field of view, so as to image positioning marks of the mask and of the wafer simultaneously in the field of view; and (iii) at least one optical distance sensor suitable for producing a distance measurement between the surface of the wafer and the mask in the field(s) of view, with a measurement beam which passes at least partially through the imaging structure.

10 Claims, 1 Drawing Sheet

(56) References Cited

U.S. PATENT DOCUMENTS

| | | | | |
|---|---|---|---|---|
| 5,114,236 A | * | 5/1992 | Matsugu | G03F 9/7076 |
| | | | | 250/548 |
| 6,088,103 A | | 7/2000 | Everett et al. | |
| 2006/0110070 A1 | | 5/2006 | Picciotto et al. | |
| 2007/0242271 A1 | | 10/2007 | Moon | |
| 2011/0102774 A1 | * | 5/2011 | Sinke | G02B 7/28 |
| | | | | 356/123 |
| 2013/0141704 A1 | | 6/2013 | Mizumura | |
| 2014/0139815 A1 | * | 5/2014 | Amir | G01N 21/4788 |
| | | | | 355/67 |

OTHER PUBLICATIONS

International Search Report from International Patent Application No. PCT/EP2014/076009, dated Apr. 10, 2015.

* cited by examiner

DEVICE AND METHOD FOR POSITIONING A PHOTOLITHOGRAPHY MASK BY A CONTACTLESS OPTICAL METHOD

BACKGROUND

The present invention relates to a device for positioning a photolithography mask with respect to the surface of a wafer, in order to carry out operations of exposure of the wafer or substrate, in contact/proximity mode photolithography in particular.

It also relates to an appliance comprising such a device, and a method implemented in this device or this appliance.

The field of the invention is more particularly, but non-limitatively, that of steppers and exposure systems in photolithography.

Photolithography techniques require operations for the exposure of the wafers being processed.

The wafer to be processed comprises a layer to be etched, covered with a photosensitive layer called the "resist" layer. A mask with transparent portions and opaque portions is positioned above the surface of the wafer. Then the surface of the wafer is illuminated or exposed through the mask with a light generally within the ultraviolet (UV) wavelengths. In the transparent portions of the mask, the light reaches the wafer and changes the properties of the photosensitive layer. After a step of chemical treatment, the portions of the resist layer situated in the exposed areas or in the protected areas according to the process (positive or negative resin), are removed in order to allow the selective etching of the uncovered portions of the layer to be etched.

These operations may be repeated many times during a process. The mask must therefore be positioned with great accuracy with respect to the surface of the wafer, so that the optical path of the exposure rays is perpendicular and equal over the entire wafer or substrate, which generally comprises already-existing structures.

The positioning in the plane X-Y (parallel to the plane of the wafer) is generally carried out by superimposing patterns (reticles, crosses, etc.) present on the mask with patterns already etched on the surface of the wafer. The mask must be positioned at a distance that allows this alignment to be carried out without affecting the photosensitive resin layer by contact.

The mask must then also be positioned at a distance Z that is constant and very accurate with respect to the surface of the wafer, and this must be done over its entire surface. This makes it possible to control the diffraction of the light which passes through the mask. In fact this diffraction directly determines the accuracy and the resolution with which the patterns of the mask can be reproduced on the wafer. Controlling this distance Z is even more important when short wavelengths (UV or Deep UV or Extreme UV EUV) are utilized in order to limit with precision the effects of diffraction and maximize the spatial resolution of the etching.

The mask must not be in contact with the wafer. It is generally positioned at a distance Z of the order of 20 micrometers or less.

In the known contact/proximity exposure systems, the positioning of the masks is carried out with microbeads or cylinders, made from ceramic material, with a calibrated diameter, which serve as shims. These microbeads or shims are firmly fixed to mobile elements making it possible to insert them between the mask and the wafer, after which the assembly is pressed.

This technique has a certain number of drawbacks:
it leads to complex systems;
the mechanical contact may degrade the contact surfaces;
controlling the positioning of the mask in the plane X-Y and over distance Z is complex, because the surfaces must not be pressed on either side of the spacers until the positioning X-Y has been carried out;
the accuracy of the thickness control is not always sufficient;
it is not possible to reduce the distance Z below a certain limit, which is however desirable for limiting the diffraction.

A subject of the present invention is to propose a device and a method for positioning a mask with respect to a wafer to be exposed which allows the drawbacks of the prior art to be overcome.

Another subject of the present invention is to propose a device and a method for positioning a mask with respect to a wafer or a substrate to be exposed which allows positioning without mechanical contact with the surface of the wafer.

Finally a subject of the present invention is to propose a device and a method for positioning a mask with respect to a wafer or a substrate to be exposed which allows accurate positioning of the mask at a very short distance from the wafer.

SUMMARY

This objective is achieved with a device for positioning a mask relative to the surface of a wafer with a view to the exposure of said wafer, comprising first positioning means suitable for holding and moving said mask and said wafer in relation to each other, characterized in that it comprises in addition:
  imaging means, suitable for producing at least one image of the mask and of the surface of the wafer according to at least one field of view, so as to image positioning marks of said mask and of said wafer simultaneously in said field of view, and
  at least one optical distance sensor, suitable for producing a distance measurement between the surface of the wafer and the mask in said field(s) of view with a measurement beam which passes at least partially through the imaging means.

According to embodiments, the device according to the invention can comprise in addition second positioning means suitable for moving the field(s) of view relative to the surface of the wafer.

According to embodiments, the device according to the invention can comprise imaging means suitable for simultaneously producing at least three images according to three fields of view.

It can comprise at least three optical distance sensors.

According to embodiments, the device according to the invention can comprise at least one optical distance sensor of one of the following types:
  confocal sensor,
  chromatic confocal sensor,
  low-coherence interferometer (temporal, spectral, frequency-scanning),
  reflectometer,
  laser interferometer.

According to embodiments, the device according to the invention can comprise at least one distance sensor which is also suitable for producing at least one of the following measurements:

a measurement of the thickness of the resist layer, a measurement of the reflectivity of the layer to be etched present below the resist layer.

According to another aspect, an appliance for the exposure of wafers is proposed, comprising a device according to the invention for positioning a mask relative to the surface of a wafer.

According to yet another aspect, a method is proposed for positioning a mask relative to the surface of a wafer with a view to the exposure of said wafer, utilizing first positioning means suitable for holding and moving said mask and said wafer in relation to each other, said method comprising the steps:

of obtaining at least one image of the mask and of the surface of the wafer according to at least one field of view, so as to image positioning marks of said mask and of said wafer simultaneously in said field of view, of obtaining, with at least one optical distance sensor and a measurement beam which passes at least partially through the imaging means, at least one distance measurement between the surface of the wafer and the mask in said field(s) of view.

The method according to the invention can comprise in addition a step of relative movement of the mask and/or of the wafer so as to, in at least one field of view:

superimpose positioning marks of the mask and of the wafer, obtain a distance measurement between the surface of the wafer and the mask which is in accordance with a predefined value.

According to embodiments, the method according to the invention can comprise a step of simultaneously obtaining at least three images according to three fields of view.

The method according to the invention can comprise in addition a step of measuring, with the optical distance sensor, at least one of the following values:

the thickness of the resist layer present on the wafer, the reflectivity of the layer to be etched present below the resist layer, from the signal acquired by said optical distance sensor.

BRIEF DESCRIPTION OF THE DRAWINGS

Other advantages and characteristics of the invention will become apparent from reading the detailed description of implementations and embodiments which are in no way limitative, and from the following attached drawings.

DETAILED DESCRIPTION

It is understood that the embodiments which will be described hereinafter are in no way limitative. Variants of the invention can in particular be imagined, comprising only a selection of features described hereinafter in isolation from the other features described, if this selection of features is sufficient to confer a technical advantage or to differentiate the invention with respect to the state of the prior art. This selection comprises at least one feature, preferably functional without structural details, or with only a part of the structural details if this part alone is sufficient to confer a technical advantage or to differentiate the invention with respect to the state of the prior art.

In particular, all the variants and all the embodiments described can be combined together if there is no technical objection to this combination.

In the figures, elements common to several figures keep the same reference.

Figure 1:
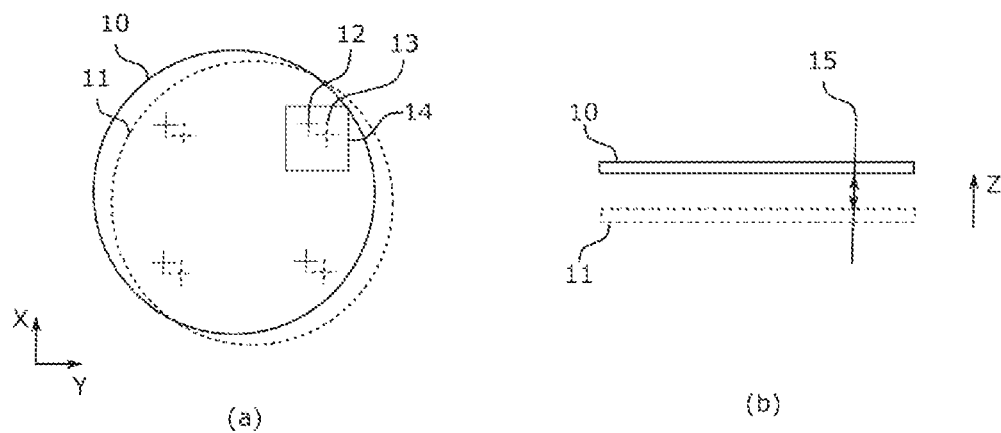
FIG. 1 shows the difficulties of positioning a mask relative to a wafer, with FIG. 1(*a*) a front view and FIG. 1(*b*) a side view.

With reference to FIG. 1, the invention is intended to be utilized in a system of exposure used in photolithography in particular and usually called a "stepper".

Such a system comprises a wafer support or chuck, in which a wafer 11 covered with photosensitive material can be fixed.

It also comprises a mask support in which a mask 10 can be positioned opposite the wafer 11. This mask 10 comprises a transparent plate (in general made from quartz) on which are deposited patterns produced in an opaque material (generally chrome). It therefore comprises transparent areas and opaque areas.

Once the mask 10 is positioned correctly with respect to the wafer 11, the assembly is exposed by means of an ultraviolet light. Thus, only the photosensitive material appearing in the transparent areas of the mask is affected. This makes it possible to etch on the wafer 11 patterns which serve to constitute electronic or optical components in particular.

To the extent that the treatment of a wafer can comprise a large number of successive operations of exposure and etching, it is very important to position the mask 10 correctly with respect to the patterns already existing on the surface of the wafer 11.

As explained previously, this positioning must be carried out in the plane of the wafer (X-Y), in translation and in rotation. To this end, the mask comprises specific patterns or crosshairs 12, which must be aligned with other crosshairs 13 already etched on the wafer 11.

In order to optimize the resolution, the mask 10 and the wafer 11 must also be positioned accurately in relation to each other along their normal (Z), so as to be properly parallel and separated by a distance according to a set value.

The invention makes it possible to carry out these alignments accurately, simultaneously, and without contact.

Figure 2:
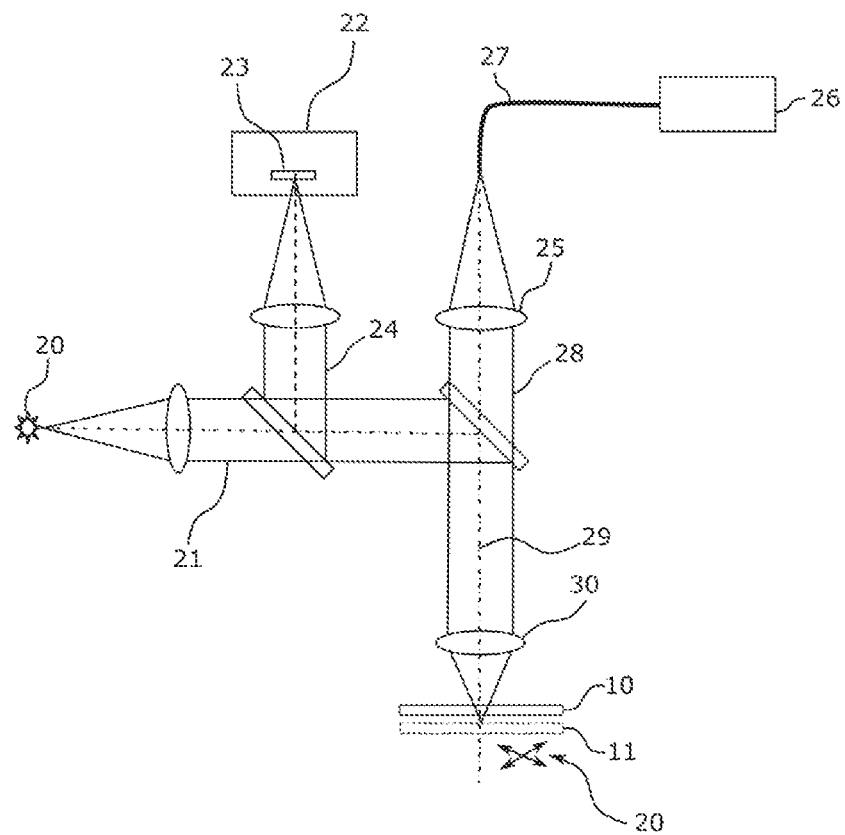
FIG. 2 shows an embodiment of a device according to the invention.

With reference to FIG. 2, the device according to the invention comprises imaging means.

These imaging means make it possible to image the mask 10 and the wafer 11 (through the transparent portions of the mask 10) according to a field of view 14.

The imaging means comprise a light source 20 and collimation means (lenses, etc.), which make it possible to generate a light beam 21 in order to illuminate the field of view 14. The light source 20 can for example comprise a halogen lamp which emits light in the visible wavelengths.

The imaging means also comprise a camera 22 with a matrix array detector 23, which can be for example of the CCD type. They also comprise optical means (lenses, etc.) which make it possible to form an image of the field of view 14 on the matrix array detector 23, from the light 24 reflected or backscattered by the mask 10 and the wafer 11.

The imaging means are positioned so that the optical axis 29 of the light and of the imaging is substantially perpendicular to the plane of the mask 10 and of the wafer 11. The imaging is thus carried out by reflection or backscattering.

The device according to the invention also comprises an optical distance sensor 26.

This sensor generates a measurement beam 28 which is inserted by means of a collimator 25 into the optical imaging system. This measurement beam passes through the distal objective 30 of the imaging means in order to form a measurement spot 15 in the field of view 14. It thus makes it possible to measure the distance between the mask 10 and the wafer 11, or more precisely the distance between the opposite faces of the mask 10 and of the wafer 11. This is a point measurement, or at least carried out at a point or within a small area 15 in the field of view 14.

The different beams (measurement, imaging, etc.) are combined and/or separated in the optical system by means of elements such as separator cubes, beam splitters, etc. according to techniques well known to a person skilled in the art.

The distance sensor 26 utilizes a measurement technique based on low-coherence interferometry in the spectral range. Light from a broad-spectrum optical source is brought via an optical fibre 27 to the collimator 25. The reflections on the surfaces of the mask 10 and of the wafer 11 of this light originating from the distance sensor 26 are collected by the collimator 25 itself and analyzed in a spectrometer. Thus a crenellated spectrum is obtained, in which the optical wavelengths for which the reflexions on the faces of the mask 10 and of the wafer 11 are in phase, correspond to maxima. Analysis of this spectrum makes it possible to deduce precisely the distance between the mask 10 and the wafer 11.

The device according to the invention also comprises first positioning means 20 which make it possible to hold and move the wafer 11 and the mask 10 in relation to each other. These positioning means can comprise any suitable mechanical system, such as translation, rotation, tilting elements, etc.

The device according to the invention also comprises second positioning means (not shown) which make it possible to move the field of view 14 over the surface of the mask 10 and of the wafer 11.

These second positioning means comprise translation stages which make it possible to move the entire imaging means in the plane X-Y of the mask, so as to be able to position the field of view 14 at any position on the surface of the mask 10 and of the wafer 11.

According to variant embodiments, any type of suitable optical distance sensor can be utilized for measuring the distance between the mask 10 and the wafer 11. There may be mentioned in particular:
  sensors utilizing low-coherence frequency-scanning interferometry techniques, with a tunable laser source and a spectral analysis carried out sequentially;
  sensors utilizing low temporal coherence interferometry techniques with a delay line for reproducing the optical delay between the signals originating from the reflections on the surfaces of the mask 10 and of the wafer 11 in particular;
  confocal chromatic sensors, in which the position in a measurement range is wavelength-coded by means of a dispersive optical element (for example at the level of the collimator 25) which introduces a chromatic aberration. The position of the interfaces (of the mask 10 and of the wafer 11) can thus be deduced from a spectral analysis of the reflected signal;
  confocal sensors, in which the position of the interfaces is determined from the detection of the intensity maxima of the light reflected during scanning in depth (Z) of the focussing point of the measurement beam 15;
  sensors based on laser interferometry techniques.

According to variant embodiments, the device according to the invention can comprise third positioning means which make it possible to move the position of the measurement point 15 of the distance sensor in the field of view 14 of the imaging means. These third positioning means can for example comprise means for moving the measurement collimator 25.

According to variant embodiments, the first and second positioning means can be implemented by the same elements, or comprise elements in common.

According to variant embodiments, the second positioning means which make it possible to move the field of view 14 over the surface of the mask 10 and of the wafer 11 can be implemented by, or comprise, mobile elements (reflecting mirrors, etc.) inserted into the optical imaging means.

According to variant embodiments, the device according to the invention can comprise a plurality of optical imaging systems such as those shown in FIG. 2, and second positioning means for independently positioning the fields of view of each of these optical imaging systems on the surface of the mask 10.

In particular, the device according to the invention can comprise three optical imaging systems, which makes it possible to adjust the relative positions of the wafer 11 and of the mask 10 in three positions simultaneously and thus to cover simultaneously all degrees of freedom.

According to embodiments, the device according to the invention can comprise optical switching means (mobile mirrors, etc.) making it possible to image sequentially several fields of view 14 placed in different positions with one and the same imaging system.

Alignment of a mask 10 and a wafer 11 with a device according to the invention comprises the following steps:
  the mask 10, the wafer 11 and the field of view 14 are positioned so that the reference marks 12 of the mask 10 to be placed in correspondence with or to be superimposed on the reference marks 13 of the wafer 11 are visible in the same field of view 14.
  the wafer 11 and the mask 10 are moved relative to each other in the plane X-Y so as to place the reference marks 12 of the mask and the reference marks 13 of the wafer in correspondence.
  the position of the field of view 14 and/or the position 15 of the measurement beam in the field of view 14 are adjusted so that the measurement beam passes through a transparent portion of the mask 10.
  the distance along the axis Z between the wafer 11 and the mask 10 is measured and adjusted to its set value by moving the wafer 11 relative to the mask 10.
  these measurement and positioning operations are carried out (sequentially or simultaneously) at several positions on the surface of the mask 10, for several reference marks 12. In fact, it is necessary to carry them out at least at two positions in order to adjust the rotation in the plane X-Y of the wafer 11 with respect to the mask 10, and at three positions in order to adjust the distance between the wafer 11 and the mask 10, so that the wafer 11 and the mask 10 are properly parallel and separated by the desired distance. Preferably therefore, these measurement and positioning operations are carried out at three positions at the surface of the mask 10, or at four positions in order to obtain a redundant measurement.

Thus, according to a particularly advantageous aspect of the invention, the wafer and the mask can be positioned very close to each other, at a distance of a few microns or a few tens of microns, without elements in mechanical contact with their surface.

According to variant embodiments, at least one of the distance sensors utilized may also be suitable for carrying out a measurement of the thickness of the photosensitive layer, or resist layer.

It is thus possible to measure the distance between the mask 10 and the wafer 11, or more precisely between the mask 10 and the upper surface of the resist layer present on the wafer 11, and the thickness of resist layer present above the layer to be etched.

This or these distance sensor(s) may also be suitable for carrying out a measurement of reflectivity of the surface of the layer to be etched present on the wafer 11 below the resist layer.

This method of utilization can be implemented with all suitable types of distance sensors, including in particular those mentioned previously (confocal sensor; chromatic confocal sensor; temporal, spectral, frequency-scanning low-coherence interferometer; reflectometer; laser interferometer, etc.). The sensors must simply be utilized in configurations suitable for carrying out multilayer measurements, well known to a person skilled in the art, and with measurement wavelengths suitable for penetrating the resist layer (in the near infrared for example).

The reflectivity measurement can be obtained from the intensity of the reflected measurement signal.

The measurements of the thickness of the resist layer and of the reflectivity of the layer to be etched are necessary information to be able to adjust the energy (exposure time and/or power) to be applied during the step of exposure.

Thus, advantageously, the invention makes it possible to measure and adjust with a single system a set of parameters essential for the exposure (the mask-wafer distance, the thickness of the resist layer and the reflectivity of the layer to be etched).

In addition, it is possible to determine the distance between the mask 10 and the surface to be etched (including the thickness of the resist layer), and thus to adjust the distance between the surface of the wafer 11 and the mask 10 while taking account of the thickness of the resist layer.

According to a variant, the device according to the invention can comprise at least a second sensor, separate from the optical distance sensor(s) 26, in order to measure the thickness of the resist layer and/or the reflectivity of the layer to be etched.

This second sensor can also comprise a measurement beam which passes at least partially through the imaging means. It can be arranged so as to carry out measurements in the field of view 14 of the imaging system.

Of course, the invention is not limited to the examples which have just been described and numerous adjustments can be made to these examples without exceeding the scope of the invention.

The invention claimed is:

1. A device for positioning a mask relative to the surface of a wafer with a view to the exposure of said wafer, comprising:
   first positioning means configured for holding and moving said mask and said wafer in relation to each other;
   imaging means configured for producing at least one image of the mask and of the surface of the wafer according to at least one field of view with an imaging beam, so as to image positioning marks of said mask and of said wafer simultaneously in said field of view; and
   at least one optical distance sensor configured for producing a distance measurement between the surface of the wafer and the mask in the field(s) of view with a measurement beam which passes at least partially through the imaging means to form a measurement spot in the field(s) of view,
   wherein the imaging means are independent from the at least one optical distance sensor, and the imaging beam is different from the measurement beam.

2. The device of claim 1, which comprises imaging means suitable for simultaneously producing at least three images according to three fields of view.

3. The device of claim 2, which comprises at least three optical distance sensors.

4. The device of claim 1, which comprises at least one optical distance sensor of one of the following types:
   confocal sensor,
   chromatic confocal sensor,
   low-coherence interferometer,
   reflectometer, and
   laser interferometer.

5. The device of claim 1, which comprises at least one distance sensor which is also suitable for producing at least one of the following measurements:
   a measurement of a thickness of a resist layer on said wafer; and
   a measurement of a reflectivity of a layer to be etched, said layer to be etched being present below said resist layer.

6. An appliance for the exposure of wafers, comprising a device according to claim 1.

7. A method for positioning a mask relative to a surface of a wafer with a view to the exposure of the wafer, utilizing first positioning means suitable for holding and moving the mask and the wafer in relation to each other, comprising:
   obtaining, with imaging means and an imaging beam, at least one image of the mask and of the surface of the wafer according to at least one field of view, so as to image positioning marks of said mask and of said wafer simultaneously in said field of view; and
   obtaining, with at least one optical distance sensor and a measurement beam which passes at least partially through the imaging means to form a measurement spot in the field(s) of view, at least one distance measurement between the surface of the wafer and the mask in this or these field(s) of view,
   wherein the imaging means are independent from the optical sensor, and the imaging beam is different from the measurement beam.

8. The method of claim 7, which comprises in addition a step of relative movement of the mask and/or of the wafer so as to, in at least one field of view:
   superimpose positioning marks of the mask and of the wafer; and
   obtain a distance measurement between the surface of the wafer and the mask which is in accordance with a predefined value.

9. The method of claim 7, which comprises a step of obtaining, simultaneously, at least three images according to three fields of view.

10. The method of claim 7, which comprises in addition a step of measuring, with the optical distance sensor, at least one of the following values:
    a thickness of a resist layer on the wafer; and
    a reflectivity of a layer to be etched, said layer to be etched being present below the resist layer, from the signal acquired by said optical distance sensor.

* * * * *